United States Patent
Karki et al.

(10) Patent No.: US 6,545,533 B2
(45) Date of Patent: Apr. 8, 2003

(54) CLASS D AUDIO SPEAKER AMPLIFIER CIRCUIT WITH PSEUDO NOISE MODULATION

(75) Inventors: James L. Karki, Garland, TX (US); Ted D. Thomas, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 3 days.

(21) Appl. No.: 09/994,947

(22) Filed: Nov. 27, 2001

(65) Prior Publication Data

US 2002/0075069 A1 Jun. 20, 2002

Related U.S. Application Data

(60) Provisional application No. 60/256,290, filed on Dec. 18, 2000.

(51) Int. Cl.[7] .......................... H03F 3/38; H03F 3/217; H03F 21/00
(52) U.S. Cl. .................. 330/10; 330/207 A; 381/120
(58) Field of Search .................. 330/10, 207 A; 381/120

(56) References Cited

U.S. PATENT DOCUMENTS

| | | | |
|---|---|---|---|
| 4,015,213 A | | 3/1977 | Hamada |
| 4,112,368 A | | 9/1978 | Ewanus et al. |
| 4,164,628 A | * | 8/1979 | Ward et al. .................. 375/150 |
| 4,301,537 A | * | 11/1981 | Roos .......................... 375/357 |
| 5,410,592 A | | 4/1995 | Wagner et al. |
| 5,512,857 A | | 4/1996 | Koskowich |
| 5,796,302 A | | 8/1998 | Masini et al. |
| 5,832,022 A | * | 11/1998 | Scott .......................... 375/142 |
| 5,982,231 A | | 11/1999 | Nalbant |
| 6,016,075 A | | 1/2000 | Hamo |
| 6,124,757 A | | 9/2000 | Newey |
| 6,127,885 A | | 10/2000 | Colangelo |
| 6,128,332 A | | 10/2000 | Fukawa et al. |
| 6,130,886 A | | 10/2000 | Ketseoglou et al. |
| 6,134,264 A | | 10/2000 | Shiba et al. |
| 6,144,705 A | | 11/2000 | Papadopoulos et al. |
| 6,208,202 B1 | * | 3/2001 | Kaufman et al. ............. 330/51 |

* cited by examiner

*Primary Examiner*—Patricia T. Nguyen
(74) *Attorney, Agent, or Firm*—April M. Mosby; Wade James Brady, III; Frederick J. Telecky, Jr.

(57) ABSTRACT

The present invention relates to a Class D amplifier and method dynamically modulate the transition zone of a square wave as a function of the input signal. An embodiment of the amplifier a pseudo noise code generator to generate a signal for spreading processing which connects to a triangle oscillator to oscillate the spreading processing signal. A modulator having an audio input port such that the modulator dynamically modulates the oscillated spreading processing signal as a function of the input signal is also included. Dithering the frequency with a Pseudo Noise (PN) code spreads the spectrum of the pulse width modulated (PWM) output; thus, eliminating the need for a demodulating filter. The modulator couples to a power amplifying switching circuit, being operative to generate a power amplified audio drive signal for application to an audio output load port in accordance with the output of the modulator. The Class D amplifier provides EMI reduction and high stability using very simple circuitry; thereby, reducing cost, circuit board area, and design time.

6 Claims, 2 Drawing Sheets

CLASS D AUDIO SPEAKER AMPLIFIER CIRCUIT WITH PSEUDO NOISE MODULATION

This application Claims the benefit of Provisional Application No. 60/256,290 filed Dec. 18, 2000.

FIELD OF THE INVENTION

The present invention relates to a class D amplifier, and, more particularly, to an audio speaker amplifier circuit having pseudo noise (PN) modulation.

BACKGROUND OF THE INVENTION

Class D amplifiers, also known as a switching amplifiers, are amplifiers that switch at a high frequency. Class D amplifiers use active power circuit elements, such as switches which are alternately driven to saturation and cut-off at a high switching speed, generating a rectangular waveform at its output. While the operation of traditional amplifiers is limited to increasing the voltage and current of input signals without significantly altering their waveforms (unless saturation occurs), class D amplifiers provide, prior to the amplification, the encoding of the information or audio signal using a particular duty-cycle modulation system, wherein the rectangular waveform can be modulated with a low-voltage signal within the audio bandwidth. Using Duty-Cycle Modulation (DCM) including Pulse Duty Cycle Modulation (PDM), or Pulse Width Modulation (PWM), the modulation results in a duty-cycle or a pulse width modulated waveform at its output. Conventionally, field effect transistor (FET) circuitry produces a PWM waveform, wherein the square wave or pulse frequency is set to meet the Nyquist criterion of at least twice the highest frequency to be amplified.

Class D amplifiers modulate the duty cycle or width of square wave pulses as a function of the input audio signal. When the volt-second area is identical for both the positive and negative pulses, the pulse cycle average is zero volts. This corresponds to a 50% duty cycle. By varying the duty cycle from the 50%, zero volt output state, the average output can be made positive or negative. The required analog signal for driving the loudspeaker is then obtained by appropriate filtering downstream of the final stage of the amplifier to remove the high-frequency carrier waveform and reconstruct the high-voltage, low-frequency waveform from the modulation input command.

The PWM modulation step converts the audio signal to be amplified into a sequence of pulses of the square waveform type, having a pulse duration that is proportional to an instant amplitude of the input signal. This type of modulation affords very high efficiency levels, in principle of up to 100%. The resultant signal, having a much different waveform from the original one, is complete with all information of the input audio signal. Since class D amplifiers use a fixed frequency triangle wave generator to implement the pulse width modulator, the resulting harmonics produced tend to extend beyond the 30M Hz in frequency range such that filtering is required to meet regulatory requirements of the Federal Communications Commission (FCC). The resultant filtered high-voltage waveform lies within the audio bandwidth and when applied to a speaker will produce sound.

More particularly, FIG. 1 shows a simplified block diagram of a conventional class D amplifier. An audio input 104 includes an audio signal to be amplified. A triangle oscillator 102 generates a triangle wave. Both the audio input 104 and the triangle oscillator 102 serve as inputs to pulse wave modulator 106. The digital or analog DCM or PWM modulator 106 that is responsive to a digital or analog input signal 104 and triangle oscillator 102, to produce a duty cycle or width modulated square wave. A power amplifier 108 is responsive to the duty cycle or width modulated square wave, to produce an amplified DCM/PWM square wave. The power amplifier 108 may employ both positive (+) and negative (−) power supplies. A low pass output filter 110 filters out Electromagnetic Interference (EMI) and the high frequency carrier waveform from the amplified DCM/PWM square wave to drive a load such as a loudspeaker (not shown) at output 112. EMI must be filtered to promote privacy since any nearby radio receiver may be capable of demodulating the signal. The conventional class D amplifier relies on post filtering to attenuate the EMI to an undetectable level and not remove the voice signal content. Thus, the resultant filter 110 is expensive due to many inductors and capacitors.

In summary, a power H-bridge-configured switching circuit 108 incorporated within the conventional class D amplifier 100, which is operative to source and sink current with respect to the output audio circuit (speaker), contains power FETs which are driven (gated on and off) by the output of the class D (pulse width modulation) amplifier, so as to effect pulse duration modulation of a pair of complementary power supply voltages for driving the speaker at the required amplification level. Harmonic energy in the switch mode signal manifests as EMI. The output of the PWM-driven power bridge switching circuit 108 is a high energy square wave-type signal, which is filtered in a downstream audio filter 110, configured as an inductive—capacitive network, to remove the switching transients and preserve the desired audio for application to one or more speakers (which constitute the load for the filter). The purpose of filter 110 is to reduce harmonics of the switch mode signal. If the amplifier drives a resistive load, it will produce a high ripple current that will consume power. Thus, within a conventional class D amplifier, not only must EMI be eliminated, but ripple current from a resistive load must be eliminated where applicable.

Thus, disadvantages of the conventional class D amplifier arise due to the use of the associated audio filter 110 downstream from the amplifier necessary to eliminate EMI and high frequency components within the amplified DCM/PWM square wave coupled with the fact that the performance of its audio output filter 110 is highly dependent upon the output load. In addition, these output filters 110 are conventionally implemented using inductive-capacitive networks that have a large number of poles which promote distortion.

One approach to improve the design of the class D amplifier is to introduce negative feedback into the amplifier circuit; yet, this solution, as described in U.S. Pat. No. 3,294,981 (which is incorporated by reference herein), is not capable of suppressing distortions brought about by the integrator implemented using negative feedback.

Thus, there is a need to provide a class D amplifier which eliminates the need for an associated audio filter and can provide high stability using very simple circuitry; thereby, reducing cost, circuit board area, and design time.

SUMMARY OF THE INVENTION

To address the above-discussed deficiencies of the class D amplifier, the present invention discloses an audio speaker amplifier circuit having pseudo noise modulation. A first embodiment of the amplifier in accordance with the present invention includes a frequency-hopping code generator to generate a signal for spreading processing which connects to a modulated triangle oscillator to oscillate the spreading processing signal. A modulator having an audio input port such that the modulator dynamically modulates the oscillated spreading processing signal as a function of the input signal is also included. It couples to a power amplifying switching circuit, being operative to generate a power amplified audio drive signal for application to an audio output load port in accordance with the output of the modulator. Dithering the frequency with frequency hopping code, such as a Pseudo Noise (PN) code, spreads the spectrum of the pulse width modulated (PWM) output.

Advantages of this design include but are not limited to a class D amplifier that eliminates the need for demodulating filtering. The amplifier in accordance with the present invention also provides high stability using very simple circuitry; thereby reducing cost, circuit board area, and design time.

Moreover, PN spreading or any other spreading technique reduces the peak energy over time of any one switching frequency or harmonic of that switching frequency. Further, PN spreading eliminates the possibility that any EMI produced will be demodulated by any nearby radio receiver. In an example, a cell phone with normal class-D amplifier may produce an EMI signal that is detectable and discernable by an unwelcome listener. PN spreading virtually eliminates discernability, by making all EMI act as random noise containing no voice signal. PN both lowers the peak sustained energy of any EMI harmonic, which deters detection, and it scrambles the voice content. This allows for smaller, inexpensive filters or in some applications elimination of the filter.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1:
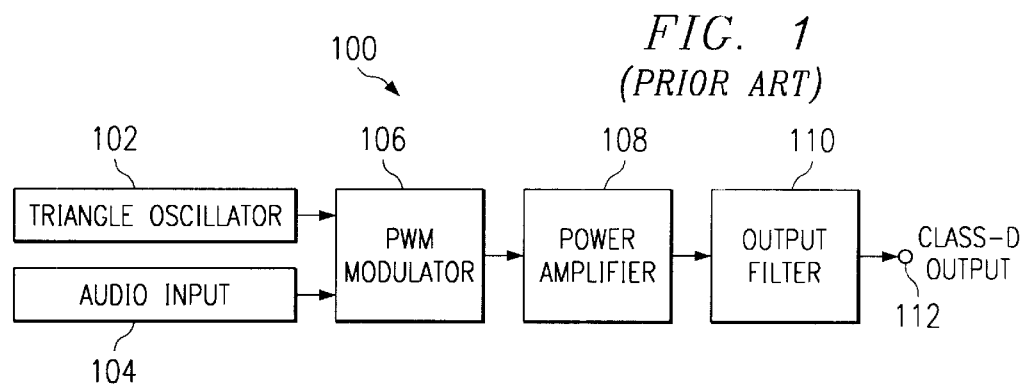
FIG. 1 is a block diagram of a known embodiment of class-D amplifier.
Figure 2:
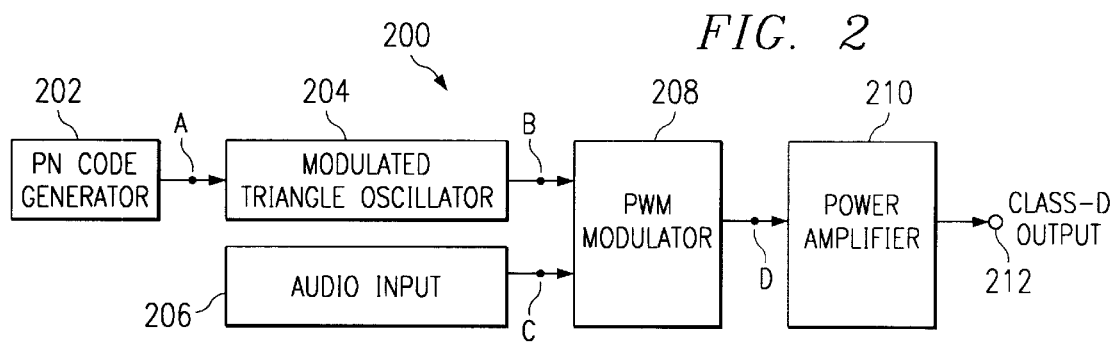
FIG. 2 is a block diagram of an embodiment of a class-D amplifier in accordance with the present invention.

In accordance with the present invention in FIG. 2, a class D amplifier 200 includes a pseudo noise (PN) code generator 202. At node A, PN code generator 202 produces an N-bit digital signal with a PN pattern having $2^N$ frequency selections. In the alternative, any frequency-hopping code generator may be used to generate a code to dither the audio signal. Certain other communication systems make use of Pseudo Noise code, a technology known as spread-spectrum communication, in which transmitted signals are spread across a frequency band which is wider than the bandwidth of the data being transmitted. In spread spectrum communication, a data signal is typically modulated with a pseudo-random chip code to generate a transmitted signal spread over a relatively wide bandwidth. The transmitted signal has a spectral density that appears essentially as noise. Consequently, spread spectrum communication provides increased security of transmitted information and reduced interference with other sensitive radio equipment being used in the surrounding environment.

Figure 4:
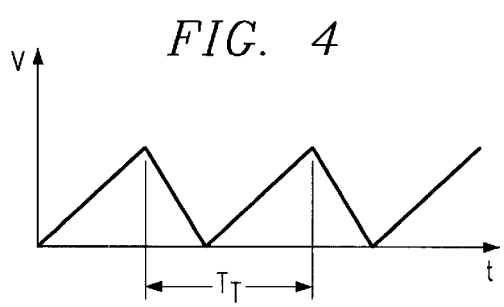
FIG. 4 shows a triangle oscillated signal voltage with respect to time.
Figure 5:
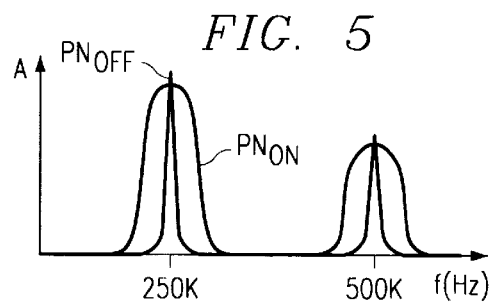
FIG. 5 displays the frequency spectrum of the triangle oscillated signal.
Figure 6:
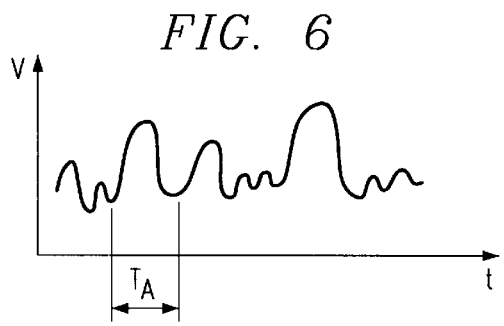
FIG. 6 illustrates an audio input signal voltage with respect to time.
Figure 7:
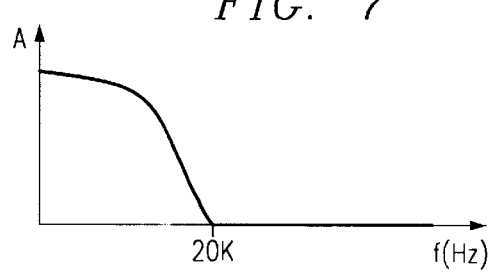
FIG. 7 displays the frequency spectrum of the audio input signal.

An audio input 206 includes a voice-paging audio signal to be amplified as shown in FIGS. 6 and 7. FIG. 6 shows a typical audio input signal voltage with respect to time at node C. FIG. 7 illustrates the amplitude relative to the frequency for this audio input signal. A triangle oscillator 204 generates a triangle wave as displayed in FIG. 4. The period $T_T$ is modulated by the N-bit PN code between $T_{Tmin}$ and $T_{Tmax}$, where $T_T$ can have $2^N$ different values. Note that the period of the audio signal $T_A$ is much greater than the period $T_T$ of the triangle oscillated signal; therefore, the frequency $f_A$ of the audio signal is much smaller than the that of the triangle oscillated signal. FIG. 5 demonstrates the amplitude of the triangle wave signal with PN code generator 202 on and off, noting signals $PN_{on}$ and $PN_{off}$.

Modulating or dithering the frequency of the triangle wave oscillator with a PN code to spread the frequency spectrum of the pulse width modulated (PWM) output solves to the problems necessitated by the conventional class-D amplifier.

Figure 9:
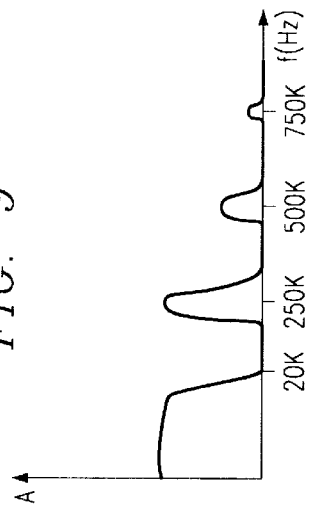
FIG. 9 shows the frequency spectrum of the pulse width modulated signal.
Figure 8:
FIG. 8 illustrates a pulse width modulated triangle oscillated signal voltage with respect to time.

Both the audio input 206 and the triangle oscillator 204 serve as inputs to pulse wave modulator 208. The pulse width modulator 208 that dynamically modulates the width of the modulated triangle wave as a function of the input signal, to produce a pulse width modulated triangle wave at node D and the output as shown in FIGS. 8 and 9, where the period $T_{PWM}$ of the pulse width modulated signal is equivalent to period $T_T$. Dithering the frequency with a Pseudo Noise (PN) code spreads the spectrum of the pulse width modulated (PWM) output. Thus, the digital or analog DCM or PWM modulator 208 is responsive to a digital or analog input signal 206 and triangle oscillator 204 to produce a duty cycle or width modulated square wave. A power amplifier 210 is responsive to the duty cycle or width modulated square wave, to produce an amplified DCM/PWM square wave. The power amplifier 210 may employ both positive (+) and negative (−) power supplies to drive a load at output 212.

Figure 3:
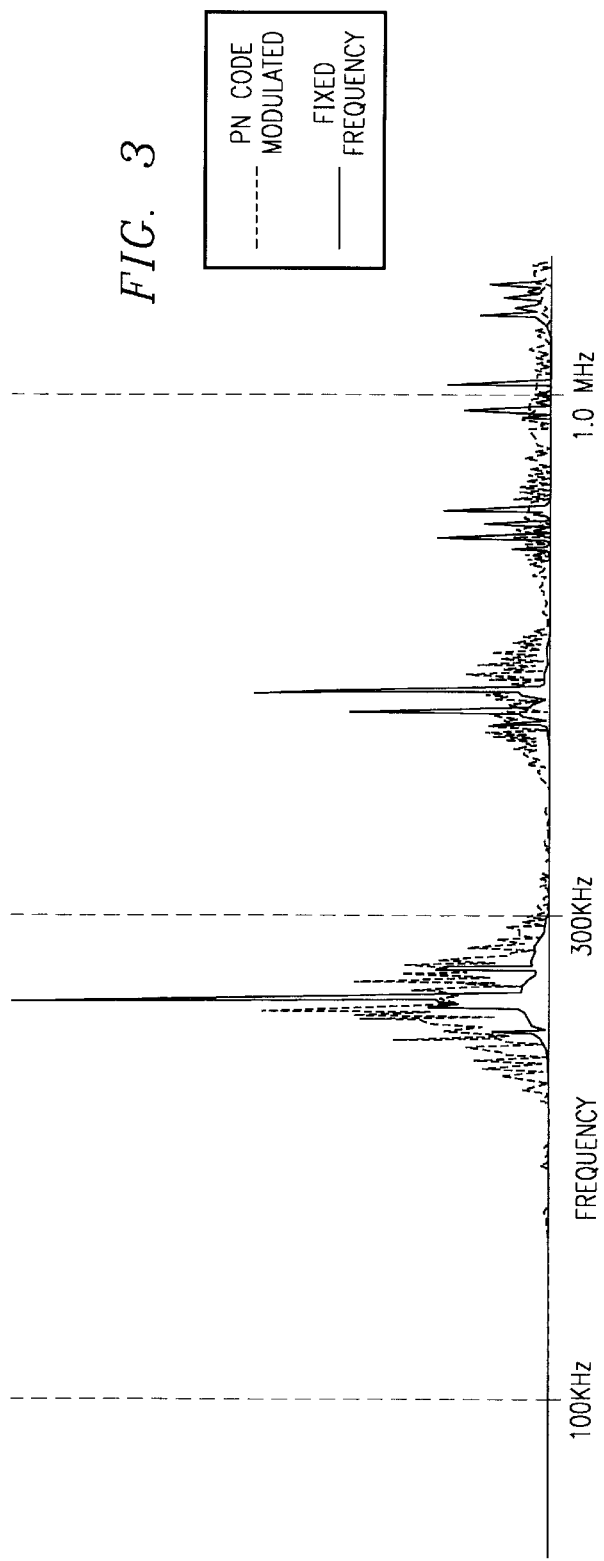
FIG. 3 illustrates the frequency spectrum of the known amplifier versus that of the amplifier in accordance with the present invention.

FIG. 3 illustrates a SPICE simulation of the spectrum of a fixed frequency PWM and one modulated with a PN code. The average power is spread over more frequencies such that the power at any specific frequency is reduced, and the required filtering is reduced or eliminated. In addition, the security of the audio input signal is increased.

The advantages of the present invention include but are not limited to a class D amplifier solution manufacturable at a reduced cost and design time. Moreover, this approach decreases the circuit board area utilized. Furthermore, PN spreading or any other spreading technique incorporated within a class D amplifier reduces the peak energy over time of any one switching frequency or harmonic of that switching frequency. In addition, PN spreading eliminates the possibility that any EMI produced will be demodulated by any nearby radio receiver. In an example, a cell phone with normal class-D amplifier may produce an EMI signal that is detectable and discernable by an unwelcome listener. PN spreading virtually eliminates discernability, by making all EMI act as random noise containing no voice signal. PN both lowers the peak sustained energy of any EMI harmonic, which deters detection, and it scrambles the voice content. This allows for smaller, inexpensive filters or in some applications elimination of the filter.

The present invention finds application in power amplifiers, digital audio equipment (including MP3 audio players), switch-mode power supplies, wireless communications, battery powered multimedia speakers and motor control drives.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. An audio amplifier circuit, comprising:
   a frequency-hopping code generator to generate a signal for spreading processing;
   a modulated triangle oscillator, having a modulation input, coupled to receive the signal from the frequency-hopping code generator to generate a spreading processing signal;
   a modulator, having an audio input port, the modulator couples to receive the spreading processing signal and an audio input signal, such that the modulator dynamically modulates the spreading processing signal as a function of the audio input signal; and
   a power amplifying switching circuit coupled to receive the output of modulator, being operative to generate a power amplified audio drive signal for application to an audio output load port.

2. An audio amplifier circuit according to claim 1, wherein the frequency-hopping code generator is a pseudo noise code generator.

3. An audio amplifier circuit according to claim 1, wherein the audio output load port is coupled to a speaker.

4. An audio amplifier circuit according to claim 1, wherein the modulator is a pulse width modulator.

5. An audio amplifier circuit according to claim 1, wherein the modulator is a duty cycle modulator.

6. A method of amplifying a signal in a class D amplifier, comprising the steps of:
   applying the signal to a signal combining circuit, which produces a resultant audio input signal;
   generating a spreading processing signal using a frequency-hopping code generator;
   applying the frequency-hopping signal to a triangle oscillator;
   coupling the resultant audio signal and oscillated signal to a modulator; and
   coupling the output of the modulator to a power amplifying switching circuit, the power amplifying switching circuit being operative to generate a power amplified audio drive signal for application to a speaker output port.

* * * * *